United States Patent
Sarhan et al.

(10) Patent No.: US 11,611,263 B1
(45) Date of Patent: Mar. 21, 2023

(54) ELECTRICAL POWER GENERATION

(71) Applicant: Sapphire Technologies, Inc., Cerritos, CA (US)

(72) Inventors: Freddie Sarhan, Cerritos, CA (US); Jeffrey Earl, Hermosa Beach, CA (US); Jeremy Liu, Norwalk, CA (US)

(73) Assignee: Sapphire Technologies, Inc., Cerritos, CA (US)

( * ) Notice: Subject to any disclaimer, the term of this patent is extended or adjusted under 35 U.S.C. 154(b) by 0 days.

(21) Appl. No.: 17/661,209

(22) Filed: Apr. 28, 2022

(51) Int. Cl.
*H02K 7/18* (2006.01)
*F02C 6/18* (2006.01)
*H05K 7/20* (2006.01)

(52) U.S. Cl.
CPC ............ *H02K 7/1823* (2013.01); *F02C 6/18* (2013.01); *F05D 2220/76* (2013.01); *H05K 7/20709* (2013.01)

(58) Field of Classification Search
CPC ...... H02K 7/1823; F02C 6/18; F05D 2220/76
See application file for complete search history.

(56) References Cited

U.S. PATENT DOCUMENTS

| | | | |
|---|---|---|---|
| 4,003,786 A * | 1/1977 | Cahn | F01K 3/265 60/659 |
| 4,110,987 A * | 9/1978 | Cahn | F01K 3/185 60/659 |
| 4,996,845 A * | 3/1991 | Kim | F02B 39/085 237/12.1 |
| 5,948,221 A | 9/1999 | Hsu | |
| 6,192,687 B1 * | 2/2001 | Pinkerton | H02J 9/066 60/657 |
| 6,463,738 B1 * | 10/2002 | Pinkerton | F01K 13/02 60/657 |
| 6,748,743 B1 * | 6/2004 | Foster-Pegg | F16K 17/403 60/660 |
| 6,777,823 B1 * | 8/2004 | Roberts | F02C 6/14 290/40 C |
| 6,938,421 B2 * | 9/2005 | Foster-Pegg | F16K 17/403 60/660 |
| 7,331,178 B2 | 2/2008 | Goldman | |
| 7,638,892 B2 | 12/2009 | Myers | |
| 7,841,306 B2 | 11/2010 | Myers et al. | |
| 8,146,360 B2 | 4/2012 | Myers et al. | |
| 8,146,374 B1 * | 4/2012 | Zien | H05K 7/208 62/238.3 |
| 8,384,232 B2 | 2/2013 | Myers et al. | |
| 8,400,005 B2 | 3/2013 | Huber et al. | |
| 8,739,538 B2 | 6/2014 | Myers et al. | |
| 8,839,622 B2 | 9/2014 | Myers et al. | |
| 9,816,490 B2 * | 11/2017 | Conlon | F02C 6/14 |
| 10,018,114 B2 | 7/2018 | Wardle et al. | |
| 10,113,535 B2 * | 10/2018 | Conlon | F03G 6/005 |
| 11,050,249 B2 * | 6/2021 | Curtis | H02J 3/003 |

(Continued)

*Primary Examiner* — Pedro J Cuevas
(74) *Attorney, Agent, or Firm* — Fish & Richardson P.C.

(57) ABSTRACT

An electric power generation system receives a gas flow at a heater, heats the gas flow at the heater with a heated fluid from a waste heat process, and directs the heated gas flow to a turbine wheel of an electric generator. The heated gas flow drives rotation of the turbine wheel, and in response to rotating the turbine wheel, electrical current is generated by the electric generator. Generated electrical current is then directed to power electronics.

21 Claims, 5 Drawing Sheets

(56) References Cited

U.S. PATENT DOCUMENTS

| | | | |
|---|---|---|---|
| 11,391,181 B2* | 7/2022 | O'Donnell | F01K 3/02 |
| 2005/0138930 A1* | 6/2005 | Foster-Pegg | F16K 17/1626 |
| | | | 60/682 |
| 2012/0013125 A1 | 1/2012 | Myers et al. | |
| 2012/0102950 A1* | 5/2012 | Turchi | F01K 23/10 |
| | | | 60/641.15 |
| 2012/0255309 A1* | 10/2012 | Venetos | F22B 33/00 |
| | | | 60/645 |
| 2014/0029196 A1* | 1/2014 | Smith | H05K 7/20763 |
| | | | 361/699 |
| 2014/0223906 A1* | 8/2014 | Gee | F01K 3/24 |
| | | | 60/641.15 |
| 2015/0354545 A1* | 12/2015 | Conlon | F01K 3/18 |
| | | | 60/39.182 |
| 2016/0156291 A1* | 6/2016 | Becker | H02P 21/30 |
| | | | 318/400.26 |
| 2016/0319560 A1* | 11/2016 | Khong | F02B 43/10 |
| 2018/0038352 A1* | 2/2018 | Conlon | F01K 3/18 |
| 2018/0245485 A1* | 8/2018 | Conlon | F03G 6/005 |
| 2019/0226462 A1* | 7/2019 | Conlon | F01K 3/02 |
| 2019/0302706 A1* | 10/2019 | Curtis | G06Q 30/0202 |
| 2021/0249857 A1* | 8/2021 | Curtis | H02J 3/003 |
| 2021/0249858 A1* | 8/2021 | Curtis | G06Q 30/0202 |

\* cited by examiner

ELECTRICAL POWER GENERATION

TECHNICAL FIELD

This disclosure relates to electrical power generation systems.

BACKGROUND

Natural gas is one of the principal sources of energy for many of our day-to-day needs and activities. Natural gas is an attractive fossil fuel for its abundance and relative cleanliness. Hydrogen is a rapidly expanding global energy storage market. Hydrogen is used in many manufacturing processes from petroleum refining to food processing. Hydrogen is also used as a fuel source for gas turbines and in a broad range of fuels cells to generate electricity in industrial and consumer transportation sectors.

The efficient and effective movement of such gases from producing regions to consumption regions requires an extensive and elaborate transportation system. Gases that are transported through pipelines travel at high pressure in the pipeline.

SUMMARY

This disclosure describes electrical power generation systems using waste heat to pre-heat process gas.

In some aspects, a method includes receiving a gas flow at a heater of an electric power generation system, heating the gas flow at the heater with a heated fluid from a waste heat process, directing the heated gas flow to a turbine wheel of an electric generator of the electric power generation system, driving rotation of the turbine wheel with the heated gas flow, generating electrical current by the electric generator in response to rotating the turbine wheel, and directing electrical current generated by the electric generator to a power electronics.

This, and other aspects, can include one or more of the following features. Directing the heated gas flow to the turbine wheel can include directing the heated gas flow through a flow control valve between the heater and the turbine wheel. Heating the gas flow at the heater can include transferring heat from the heated fluid to the gas flow with a heat exchanger. The heat exchanger can include a first heat exchanger portion in contact with the gas flow and a second heat exchanger portion in contact with a heated fluid from the waste heat process, and transferring heat from the heated fluid to the gas flow can include transmitting heat across the heat exchanger from the heated fluid in contact with the second heat exchanger portion to the gas flow in contact with the first heat exchanger portion. The heated fluid from the waste heat process can include at least one of heated fluid from a data server at a data center, heated fluid from a chiller of the data center, or heated air from a cooling tower of the data center, and heating the gas flow can include transferring heat to the gas flow from the heated fluid or the heated air. The heated fluid from the waste heat process can include exhaust gas from a combustion engine, and heating the gas flow can include transferring heat from the exhaust gas to the gas flow. The heated fluid from the waste heat process can include exhaust gas from a gas turbine, and heating the gas flow can include transferring heat from the exhaust gas to the gas flow. The heated fluid from the waste heat process can include fluid from a cooling jacket of a motor, and heating the gas flow can include transferring heat from the fluid from the cooling jacket to the gas flow. The motor can include a combustion engine or a gas turbine. The heated fluid from the waste heat process can include waste fluid from a refinery, and heating the gas flow can include transferring heat from the waste fluid to the gas flow. The heated fluid from the waste heat process can include heated fluid from solar radiation, and heating the gas flow can include transferring heat from the heated fluid to the gas flow. The method can further include outputting the gas flow from the electric power generation system at a desired output temperature.

In certain instances, an electric power generation system includes an electric generator. The electric generator includes a turbine wheel to receive process gas and rotate in response to expansion of the process gas flowing into an inlet of the turbine wheel and out of an outlet of the turbine wheel, a rotor coupled to the turbine wheel to rotate with the turbine wheel, and a stationary stator, where the electric generator generates an alternating current upon rotation of the rotor within the stator. The electric power generation system also includes a power electronics system electrically connected to an electrical output of the electric generator and to receive alternating current from the electric generator, and a heater fluidly coupled to an inlet of the electric generator and to a waste heat fluid source, where the heater transmits heat from fluid from the waste heat fluid source to the process gas.

This, and other aspects, can include one or more of the following features. The heater can include a heat exchanger. The heat exchanger can include a first heat exchanger portion in contact with the process gas and a second heat exchanger portion in contact with the fluid from the waste heat fluid source. The waste heat fluid source can include at least one of a data center, a combustion engine exhaust, a gas turbine exhaust, a motor cooling jacket, a refinery, or solar radiation. The fluid from the waste heat fluid source can include at least one of waste air from a data center, heated coolant from a data center, exhaust gas, cooling jacket fluid, or refinery waste fluid. The power electronics system can include a variable speed drive connected to the electrical output of the electric generator, the variable speed drive to convert the alternating current received from the electric generator into an alternating current compatible with a power grid. The electric generator can include a three-phase permanent magnet synchronous generator.

Certain aspects of the disclosure encompass a method including receiving a gas flow at a heater of an electric power generation system, heating the gas flow at the heater with a heated fluid from a waste heat process, the heater including a heat exchanger to transmit heat from the heated fluid to the gas flow, directing the heated gas flow to a turbine wheel of an electric generator of the electric power generation system, driving rotation of the turbine wheel with the heated gas flow, and generating electrical current by the electric generator in response to rotating the turbine wheel.

The details of one or more implementations of the subject matter described in this disclosure are set forth in the accompanying drawings and the description below. Other features, aspects, and advantages of the subject matter will become apparent from the description, the drawings, and the claims.

BRIEF DESCRIPTION OF THE DRAWINGS

Like reference symbols in the various drawings indicate like elements. Drawings not to scale.

DETAILED DESCRIPTION

Natural gas, hydrogen, and other process gases are pressurized to facilitate efficient transportation in pipelines that are sometimes many miles long. The pipelines, for example, transport gasses from production sites (e.g., wells) to processing facilities and from processing facilities to local distribution networks, such as regional, city or district networks or on site industrial plants networks. To deliver the gas safely through local distribution networks and for use, the process gas is depressurized to lower levels (often using pressure regulators). The pressure is stepped down at pressure letdown (PLD) stations for delivery to industrial, commercial, and residential end users. The PLD stations use regulating valves to achieve the required pressure drop, but also waste significant amounts of energy in the process. Additional regulating valves can be used at other locations for pressure control, such as in the pipelines between the production and processing facilities, within the sub-processes of the processing facilities, and within the end user's processes and piping. A turboexpander generator can be installed in parallel to the regulating valve to recover the wasted energy from pressure reduction and produce electrical power. The electrical power can be directed to a power grid or elsewhere. Along the same lines, a turboexpander generator can be installed at a gas storage facility upstream of one or more storage tanks to recover high pressure gasses dispensed from a tanker truck, through the turboexpander generator, to the storage tanks. The turboexpander generator is relevant in other applications, such as in a hydrogen liquefaction process where gaseous hydrogen that has been cooled and pressurized is expanded to a liquid state. The expansion can be performed through a turboexpander generator to recover the wasted energy from the expansion and produce electrical power. As above, the electrical power can be directed to a power grid or elsewhere, such as used to power compressors or other components of the liquefaction process. In each instance, by recovering lost energy from natural gas and hydrogen pressure letdown applications, the turboexpander can generate electricity while also increasing overall plant efficiency, offsetting electrical costs, and generating additional revenue.

Figure 1:
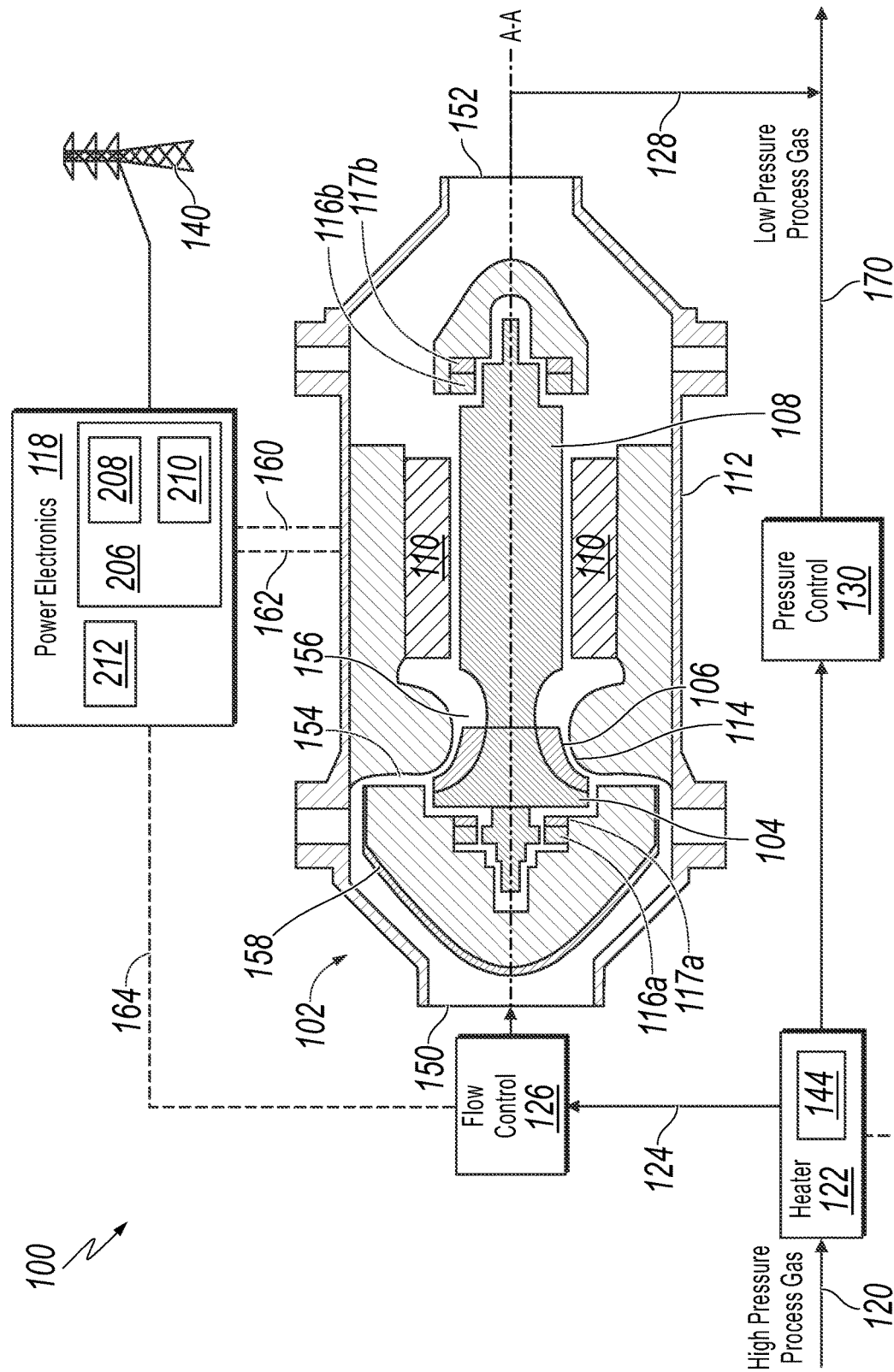
FIG. 1 is a schematic diagram of an electric power generation system coupled to a power grid in accordance with embodiments of the present disclosure.

FIG. 1 is a schematic diagram of an electric power generation system 100 coupled to a power grid 140 in accordance with embodiments of the present disclosure. The electric power generation system 100 can be added at a PLD station to capture energy from gas expansion from the PLD process, or in any of the other applications described above. The electric power generation system 100 includes a turboexpander 102 in parallel with a pressure control valve 130. The turboexpander 102 is arranged axially so that the turboexpander 102 can be mounted in-line with a pipe. The turboexpander 102 acts as an electric generator by converting kinetic energy to rotational energy from gas expansion through a turbine wheel 104 and generating electrical energy. For example, rotation of the turbine wheel 104 can be used to rotate a rotor 108 within a stator 110, which then generates electrical energy.

The turboexpander 102 includes a high-performance, high-speed permanent magnet generator with an integrated radial in-flow expansion turbine wheel 104 and low loss active magnetic bearings (AMBs) 116a,b. The rotor assembly includes the permanent magnet section with the turbine wheel 104 mounted directly to the rotor hub of the rotor 108. The rotor 108 is levitated by the magnetic bearing system, for example, at longitudinal ends (e.g., axial ends) of the rotor 108, creating a frictionless (or near frictionless) interface between dynamic and static components. The AMBs 116a,b facilitate a lossless (or near lossless) rotation of the rotor 108.

The turboexpander 102 is designed to have the process gas flow through the system, which cools the generator section and eliminates the need for auxiliary cooling equipment. The power electronics 118 for the turboexpander 102 combines a Variable Speed Drive (VSD) 206 and Magnetic Bearing Controller (MBC) 212 into one cabinet, in some implementations. The VSD allows for a consistent and clean delivery of generated power from the turboexpander 102 to a power grid 140. For example, the VSD 206 regulates the frequency and/or amplitude of the generated current to match the local grid. After expansion, the gas exits the turboexpander 102 along the same axial path for downstream processes.

The turboexpander 102 includes a flow-through configuration. The flow-through configuration permits process gas to flow from an inlet side of the turboexpander 102 to an outlet side of the turboexpander 102. The gas flows into a radial gas inlet 154 to a turbine wheel 104 and an axial gas outlet 156 from the turbine wheel 104. The gas then flows through the generator and out of the outlet 152, where the gas rejoins the gas pipeline 170. Generally, high pressure process gas 120 is directed to flow into the turboexpander 102 through a flow control system 126. The flow control system 126 includes a flow or mass control valve and an emergency shut off valve. In embodiments, the turboexpander housing 112 is hermetically sealed.

The high pressure process gas 120 is expanded by flowing through the turbine wheel 104, resulting in a pressure letdown of the process gas. Lower pressure process gas 128 exits the turboexpander 102. The expansion of the high pressure process gas 120 through the turbine wheel 104 causes the turbine wheel 104 to rotate, which causes the rotor 108 to rotate. The rotation of the rotor 108 within the stator 110 generates electrical energy. The turboexpander 102 achieves the desired pressure letdown and captures the energy from the pressure letdown to generate electricity. A pressure control valve 130, such as a conventional pressure regulator, can be installed in parallel to the turboexpander 102. The pressure control valve 130 can be used to control the pressure of the high pressure process gas 120 that flows in parallel to the turboexpander 102. Any excess high pressure process gas that is not directed into the turboexpander can be directed through the pressure control valve 130.

In some embodiments, a heater 122 can heat the high pressure process gas 120 prior to flowing the gas into the turboexpander 102. For example, if the expansion of the gas through the turbine wheel 104 would lower the temperature of the process gas to a point where moisture in the gas freezes and/or process gas components condense at, or downstream of, the turbine wheel or at other downstream locations in the pipeline, the pressurized process gas 120 can be heated by heater 122 prior to flowing through the turboexpander 102. Heated high pressure process gas 124 can then be directed into the turboexpander 102. The heating of the process gas can prevent freezing moisture or component condensation as the gas expands and its temperature drops.

The turboexpander 102 includes a turbine wheel 104. The turbine wheel 104 is shown as a radial inflow turbine wheel, though other configurations are within the scope of this disclosure, such as axial flow turbine wheels. In this example, heated high pressure process gas 124 is received from an inlet conduit 150 of the housing 112 enters a radially oriented inlet 154 of the turbine wheel 104. In certain embodiments, the fluid flows through an inlet conduit 150 and is diverted by a flow diverter 158 to a radial inlet 154 that directs the flow into the radial inflow of the turbine wheel 104. In the example turboexpander 102 of FIG. 1, the flow diverter 158 includes a cone-shaped nose that diverts the gas flow radially outward to the radial inlet 154. The flow diverter 158 can be connected to or integrally formed with the bearing 116a and sensor 117a at the inlet side of the turboexpander 102 and the supports for this bearing 116a and sensor 117a surrounding the axial end of the rotor 108 at the inlet end of the turboexpander 102. After expanding, the lower pressure process gas exits the turbine wheel 104 from an axially oriented outlet 156 to outlet conduit 152 of the housing 112 at the outlet end of the turboexpander 102.

The turbine wheel 104 can be directly affixed to the rotor 108, or to an intermediate common shaft, for example, by fasteners, rigid drive shaft, welding, or other manner. For example, the turbine wheel 104 may be received at an axial end of the rotor 108, and held to the rotor 108 with a shaft. The shaft threads into the rotor 108 at one end, and at the other end, captures the turbine wheel 104 between the end of rotor 108 and a nut threadingly received on the shaft. The turbine wheel 104 and rotor 108 can be coupled without a gearbox and rotate at the same speed. In other instances, the turbine wheel 104 can be indirectly coupled to the rotor 108, for example, by a gear train, clutch mechanism, or other manner.

The turbine wheel 104 includes a plurality of turbine wheel blades 106 extending outwardly from a hub and that react with the expanding process gas to cause the turbine wheel 104 to rotate. FIG. 1 shows an unshrouded turbine wheel, in which each of the turbine blades 106 has an exposed, generally radially oriented blade tip extending between the radial inlet 154 and axial outlet 156. As discussed in more detail below, the blade tips substantially seal against a shroud 114 on the interior of the housing 112. In certain instances, the turbine wheel 104 is a shrouded turbine wheel.

In configurations with an un-shrouded turbine wheel 104, the housing 112 includes an inwardly oriented shroud 114 that resides closely adjacent to, and at most times during operation, out of contact with the turbine wheel blades 106. The close proximity of the turbine wheel blades 106 and shroud 114 substantially seals against passage of process gas therebetween, as the process gas flows through the turbine wheel 104. Although some amount of the process gas may leak or pass between the turbine wheel blades 106 and the shroud 114, the leakage is insubstantial in the operation of the turbine wheel 104. In certain instances, the leakage can be commensurate with other similar unshrouded-turbine/ shroud-surface interfaces, using conventional tolerances between the turbine wheel blades 106 and the shroud 114. The amount of leakage that is considered acceptable leakage may be predetermined. The operational parameters of the turbine generator may be optimized to reduce the leakage. In embodiments, the housing 112 is hermetically sealed to prevent process gases from escaping the radial inlet 154 of the turbine wheel 104.

The shroud 114 may reside at a specified distance away from the turbine wheel blades 106, and is maintained at a distance away from the turbine wheel blades 106 during operation of the turboexpander 102 by using magnetic positioning devices, including active magnetic bearings and position sensors.

Bearings 116a and 116b are arranged to rotatably support the rotor 108 and turbine wheel 104 relative to the stator 110 and the shroud 114. The turbine wheel 104 is supported in a cantilevered manner by the bearings 116a and 116b. In embodiments, the turbine wheel 104 may be supported in a non-cantilevered manner and bearings 116a and 116b may be located on the outlet side of turbine wheel 104. In certain instances, one or more of the bearings 116a or 116b can include ball bearings, needle bearings, magnetic bearings, foil bearings, journal bearings, or other bearing types.

Bearings 116a and 116b may be a combination radial and thrust bearing, supporting the rotor 108 in radial and axial directions. Other configurations could be utilized. The bearings 116a and 116b need not be the same types of bearings.

In the embodiments in which the bearings 116a and 116b are magnetic bearings, a magnetic bearing controller (MBC) 212 is used to control the magnetic bearings 116a and 116b. Position sensors 117a, 117b can be used to detect the position or changes in the position of the turbine wheel 104 and/or rotor 108 relative to the housing 112 or other reference point (such as a predetermined value). Position sensors 117a, 117b are connected to the housing 112 directly or indirectly, and the position sensors 117a, 117b can detect axial and/or radial displacement of the rotor 108 and its connected components (e.g., turbine wheel 104) relative to the housing 112. The magnetic bearing 116a and/or 116b can respond to the information from the positions sensors 117a, 117b and adjust for the detected displacement, if necessary. The MBC 212 may receive information from the position sensor(s) 117a, 117b and process that information to provide control signals to the magnetic bearings 116a, 116b. MBC 212 can communicate with the various components of the turboexpander 102 across a communications channel 162.

The use of magnetic bearings 116a, 116b and position sensors 117a, 117b to maintain and/or adjust the position of the turbine wheel blades 106 such that the turbine wheel blades 106 stay in close proximity to the shroud 114 permits the turboexpander 102 to operate without the need for seals (e.g., without the need for dynamic seals). The use of the active magnetic bearings 116a,b in the turboexpander 102 eliminates physical contact between rotating and stationary components, as well as eliminate lubrication, lubrication systems, and seals.

The turboexpander 102 may include one or more backup bearings. For example, at start-up and shut-down or in the event of a power outage that affects the operation of the magnetic bearings 116a and 116b, bearings may be used to rotatably support the turbine wheel 104 during that period of time. The backup bearings and may include ball bearings, needle bearings, journal bearings, or the like.

As mentioned previously, the turboexpander 102 is configured to generate electricity in response to the rotation of the rotor 108. In certain instances, the rotor 108 can include one or more permanent magnets coupled to the rotor 108, for example, on a radially outer surface of the rotor 108 adjacent to the stator 110. The stator 110 includes a plurality of conductive coils, for example, positioned adjacent to the magnet(s) on the rotor 108. Electrical current is generated by the rotation of the magnet(s) within the coils of the stator 110. The rotor 108 and stator 110 can be configured as a synchronous, permanent magnet, multiphase alternating current (AC) generator. The electrical output 160 can be a three-phase output, for example. In certain instances, stator 110 may include a plurality of coils (e.g., three or six coils for a three-phase AC output). When the rotor 108 is rotated, a voltage is induced in the stator coil. At any instant, the magnitude of the voltage induced in the coils is proportional to the rate at which the magnetic field encircled by the coil is changing with time (i.e., the rate at which the magnetic field is passing the two sides of the coil). In instances where the rotor 108 is coupled to rotate at the same speed as the turbine wheel 104, the turboexpander 102 is configured to generate electricity at that speed. Such a turboexpander 102 is what is referred to as a "high speed" turbine generator. For example, in embodiments, the turboexpander 102 can produce up to 135 kilowatts (kW) of power at a continuous speed of 25,000 revolutions per minute (rpm) of the rotor 108. In embodiments, the turboexpander 102 can produce on the order of 315 kW at certain rotational speeds (e.g., on the order of 23,000 rpm).

In some embodiments, the design of the turbine wheel 104, rotor 108, and/or stator 110 can be based on a desired parameter of the output gas from the turboexpander 102. For example, the design of the rotor 108 and stator 110 can be based on a desired temperature of the gas 128 at input of the turboexpander 102, output of the turboexpander 102, or both.

In the example system 100 of FIG. 1, the turboexpander 102 is coupled to power electronics 118. Power electronics 118 includes the variable speed drive (VSD) 206 (or variable frequency drive) and the magnetic bearing controller (MBC) 212 (discussed above).

The electrical output 160 of the turboexpander 102 is connected to the VSD 206, which can be programmed to specific power requirements. The VSD 206 can include an insulated-gate bipolar transistor (IGBT) rectifier 208 to convert the variable frequency, high voltage output from the turboexpander 102 to a direct current (DC). The rectifier 208 can be a three-phase rectifier for three-phase AC input current. An inverter 210 then converts the DC from the rectifier AC for supplying to the power grid 140. The inverter 210 can convert the DC to 380 VAC-480 VAC at 50 to 60 Hz for delivery to the power grid. The specific output of the VSD 206 depends on the power grid and application. Other conversion values are within the scope of this disclosure. The VSD 206 matches its output to the power grid 140 by sampling the grid voltage and frequency, and then changing the output voltage and frequency of the inverter 210 to match the sampled power grid voltage and frequency.

The turboexpander 102 is also connected to the MBC 212 in the power electronics 118. The MBC 212 constantly monitors position, current, temperature, and other parameters to ensure that the turboexpander 102 and the active magnetic bearings 116a and 116b are operating as desired. For example, the MBC 212 is coupled to position sensors 117a, 117b to monitor radial and/or axial position of the turbine wheel 104 and the rotor 108. The MBC 212 can control the magnetic bearings 116a, 116b to selectively change the stiffness and damping characteristics of the magnetic bearings 116a, 116b as a function of spin speed. The MBC 212 can also control synchronous cancellation, including automatic balancing control, adaptive vibration control, adaptive vibration rejection, and unbalance force rejection control.

Figure 2:
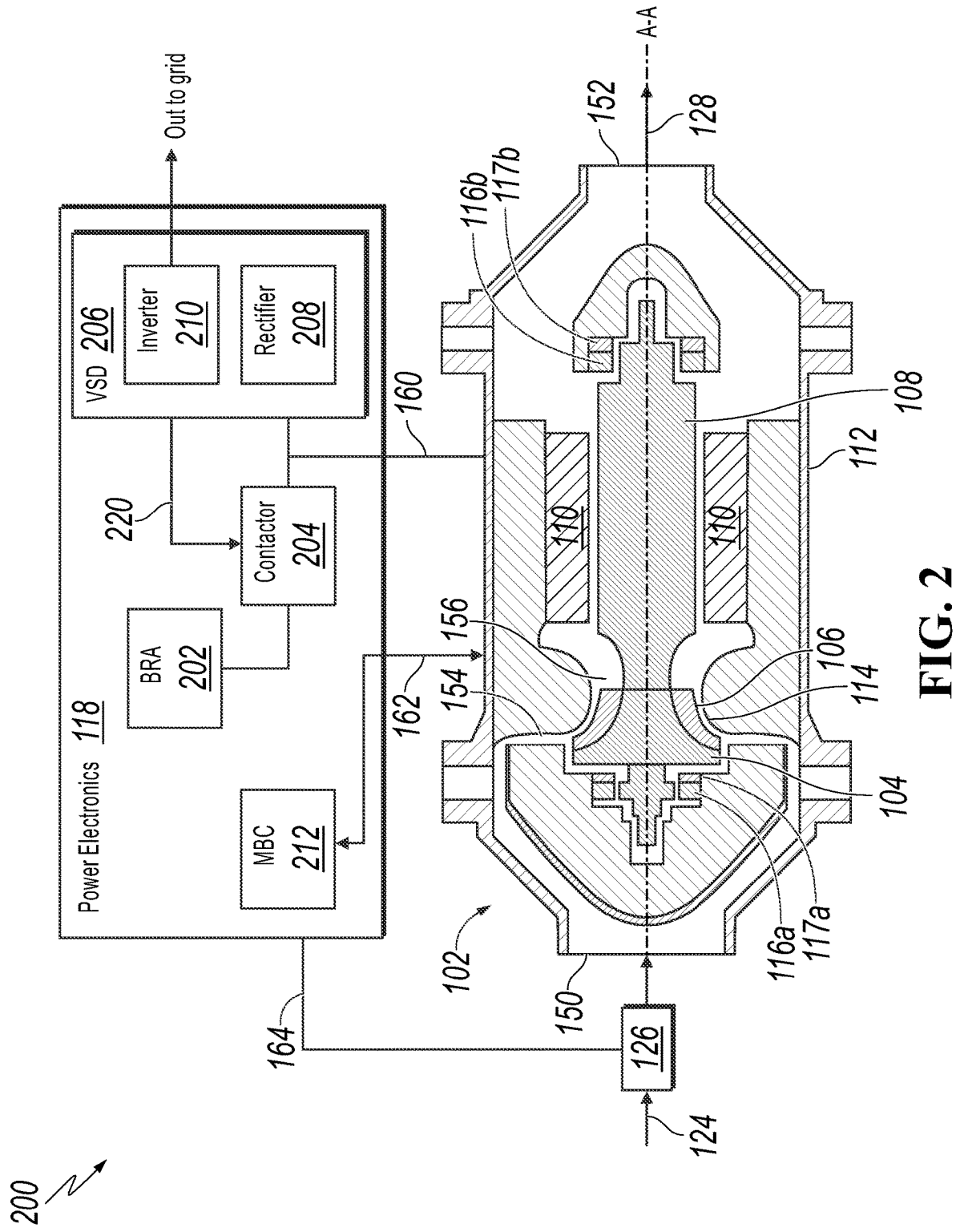
FIG. 2 is a schematic diagram of an example turboexpander system in accordance with embodiments of the present disclosure.

FIG. 2 is a schematic diagram of an example turboexpander system 200 that includes a brake resistor assembly 202 in accordance with embodiments of the present disclosure. Turboexpander system 200 includes a turboexpander 102 and a power electronics 118. The turboexpander 102 receives a heated high pressure process gas 124, which causes a turbine wheel 104 to rotate. The rotation of the turbine wheel 104 rotates a rotor 108 that supports a plurality of permanent magnets. The rotation of the permanent magnets on the rotor 108 induces a current through coils or windings on stator 110.

The electric generator system acts as a brake on the rotor 108. This braking torque converts the shaft power, created by the process gas flow, to electrical power that can be put on an electrical grid, for example. In the case of a grid failure, inverter failure, or other fault condition, braking torque is lost and the rotor 108 may spin up towards an undesirable overspeed. To prevent overspeed, the power can be diverted to a brake resistor assembly 202 that can temporarily absorb the electricity until the process gas flow is reduced or removed (e.g., by flow control system 126) or until the fault condition is resolved. Flow control system 126 can include a one or a combination of a flow control valve or a mass control valve or an emergency shutoff valve. Flow control system 126 can be controlled by power electronics 118 or other electrical, mechanical, or electromagnetic signal. For example, a fault condition can signal the flow control system 126 to close or partially close, thereby removing or restricting gas supply to the turboexpander 102. Restricting or removing gas flow to the turboexpander slows the rotation of the turbine wheel and consequently, slows the rotor. In the example shown in FIGS. 1 and 2, a signal channel 164 from the power electronics 118 can be used to open and/or close the flow control system 126.

A fault condition can include a grid failure, VSD failure, inverter failure, or other fault condition. A fault condition can include any condition that removes or reduces the braking torque on the rotor 108.

A brake resistor assembly 202 is electrically connected to the electrical output 160 of the turboexpander 102 (e.g., the output of the generator). The brake resistor assembly 202 can have a tuned impedance to allow an efficient transfer of power from the turboexpander 102 to the brake resistor assembly 202.

In embodiments, a contactor 204 can connect the output current of the turboexpander 102 to the brake resistor assembly 202 when there is a fault condition at the VSD 206 or the power grid 140. The contactor 204 is an electrically controlled switch for switching in an electrical power circuit. The contactor 204 can accommodate the three-phase current output from the generator to direct the current to the brake resistor assembly 202.

In some embodiments, the contactor 204 is connected directly to the (three-phase) electrical output 160 of the turboexpander 102. In some embodiments, the brake resistor assembly 202 and/or the contactor 204 are not part of the power electronics, but are connected to the electrical output 160 of the turboexpander 102 outside of the power electronics 118.

The VSD 206 can provide an energizing signal 220 to the coil of the contactor 204 to cause the contactor 204 to connect the electrical output 160 of the turboexpander to the brake resistor assembly 202. Depending on the implementation choice, the contactor 204 can be a normally closed (NC) contactor or a normally open (NO) contactor.

For example, in an example implementation using a NO contactor, during normal operating conditions, the electrical output 160 of the turboexpander 102 is connected to the VSD 206 and supplies three-phase AC current to the VSD 206. In a fault condition, the VSD can energize the contactor 204 to connect the contactor 204 to the electrical output 160 of the turboexpander 102. In some implementations, the energizing signal 220 to the contactor 204 can be provided by another source that can respond to a fault condition (e.g., another component of the power electronics 118 or another component outside the power electronics 118). In this implementation, if failure of the VSD 206 is the cause of the fault condition, the contactor 204 can operate independent of the VSD 206.

If an NC contactor is used, then the VSD 206 (or other source) provides an energizing signal 220 to the contactor 204 to keep the contactor switches open during normal operating conditions. A fault condition can result in the removal of the energizing signal 220 to the contactor 204, which results in the contactor switches closing and completing the circuit between the electrical output 160 of the turboexpander 102 and the brake resistor assembly 202.

As described earlier, the heater 122 can heat the high pressure process gas 120 prior to flowing the gas into the turboexpander 102. Heating the gas flow 120 prior to entering the turboexpander 102 can increase the temperature of the gas prior to a pressure drop of the gas through the turboexpander 102, for example, to avoid freezing of condensates or hydrates present in the gas flow caused by the pressure drop in the gas through the turboexpander 102. The heated high pressure process gas 124 can be directed into the turboexpander 102 from the heater 122. The heater 122 can take a variety of forms, and use a number of different fuels to generate heat. For example, the heater 122 can include a line heater that generates by burning natural gas in the line heater. In some implementations, the heater 122 includes a heat exchanger that removes heat from various heat generating processes, and the removed heat is provided, in whole or in part, to the process gas 120 with the heater 122.

In some implementations, since heat is a waste byproduct of many processes, the heater 122 can connect to waste heat processes 142 in order to receive the waste heat and apply this waste heat to the process gas flow 120. The heater 122 directs all or a portion of this waste heat to the process gas 120, for example, to pre-heat the process gas 120 to a desired temperature. The various waste heat processes 142 that the heater 122 can connect to and divert waste heat to the process gas 120 includes data center temperature control processes, gas turbine or combustion engine processes, refinery processes, solar radiation, and/or others. For example, the heater 122 can receive waste heat from a data center(s), waste heat from a gas turbine or combustion engine, waste heat from exhaust gas of a gas turbine or combustion engine, waste heat from refinery and/or other chemical plant processes, or waste heat from solar radiation. The waste heat is directed to the heater 122 in the form of a gas or fluid, and the heater 122 transfers heat from the gas or fluid to the process gas 120. In some implementations, the waste heat process 142 is unrelated to the turboexpander 102, for example, in that it does not utilize the power generated by the turboexpander 102. In some implementations, the grid 140 can be a local grid at the data center or plant having the waste heat process 142 and the power generated by the turboexpander 102 can power or supplement power on that grid 140. In certain instances, the grid 140 can include a national, regional, or municipal power grid, or a local grid, for example, for supplying power to a building, campus, and/or industrial manufacturing or processing plant. In some implementations, the waste heat process 142 is unrelated to the process gas 120, for example, in that it does not use the process gas 120 and is not involved in sourcing or processing the process gas 120. In some implementations, the process gas 120 is sourced by, processed and/or used by the engine and/or process.

The heater 122 includes a heat exchanger 144 that connects to the process gas 120 on a first side of the heat exchanger 144. On a second, opposite side of the heat exchanger 144 is the waste heat from the data center, heated fluid from the fluid cooling jacket, exhaust gas from the gas turbine or combustion engine, and/or refinery waste heat. A first heat exchanger portion on the first side of the heat exchanger 144 is positioned in contact with process gas 120, and a second heat exchanger portion on the second side of the heat exchanger 144 is positioned in contact with the heated fluid from the waste heat process 142. Transferring heat from the heated fluid to the process gas 120 can include transmitting heat across the heat exchanger 144 from the heated fluid in contact with the second heat exchanger portion to the process gas 120 in contact with the first heat exchanger portion. Each or both of the heat exchanger portions of the heat exchanger 144 can include a heat sink, for example, with fins disposed in the respective fluid. Since the heated fluid is at a higher temperature than the process gas 120, the heat exchanger 144 captures heat from the higher-temperature heated fluid and transfers the captured heat to the lower-temperature process gas 120. In the context of a shell and tube heat exchanger, the tubes can be the first heat exchanger portion and the shell the second, or vice versa.

Figure 3:
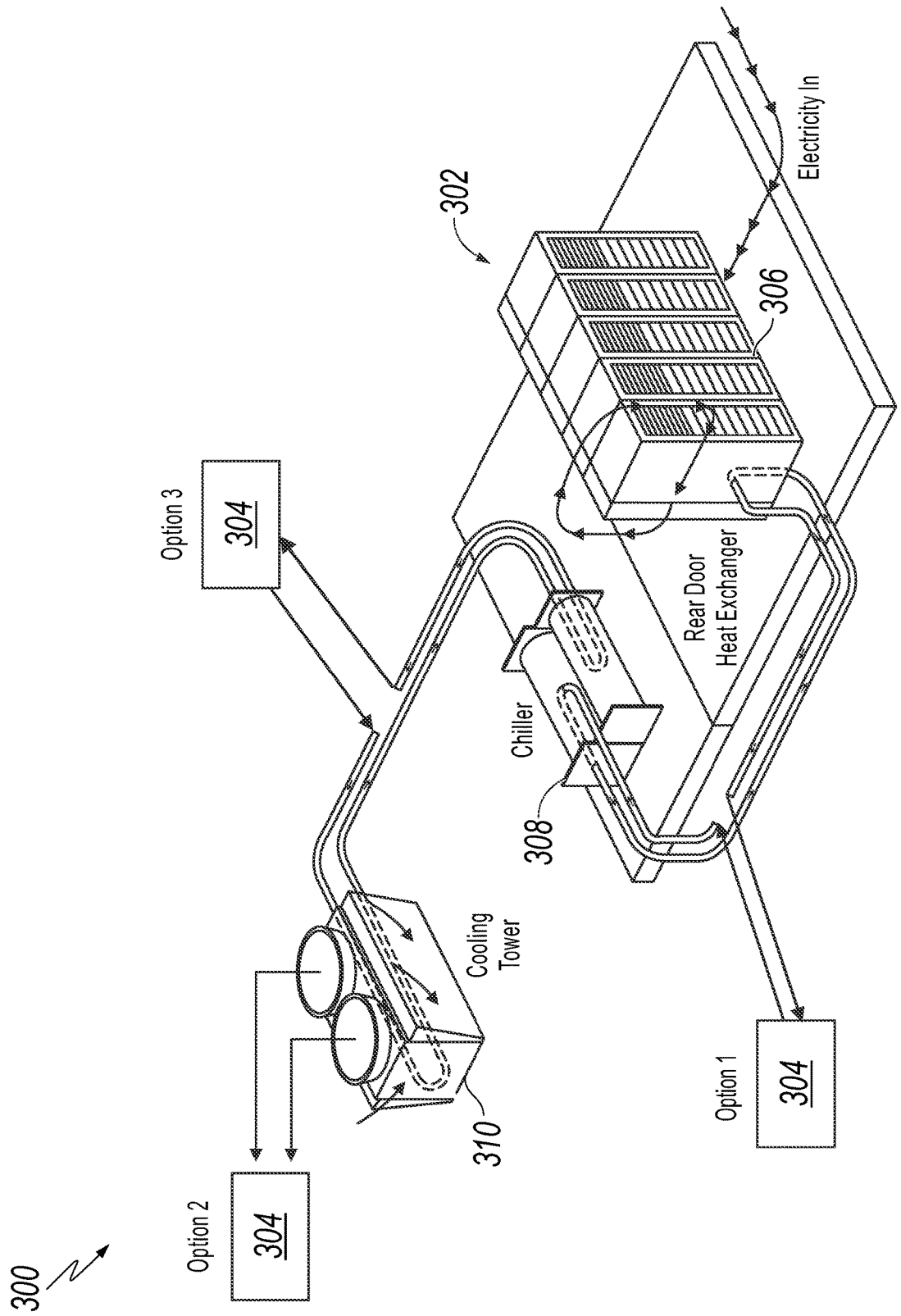
FIG. 3 is a schematic perspective view of an example heat exchanger system for a data center farm that is fluidly connected to a heat exchanger.

When the waste heat process 142 is a data center, such as a server cluster, cryptocurrency mining process, or other data center, heat exchanger 144 can be connected directly with the hot air/fluid output of the waste heat process 142 to transfer at least some of the waste heat to the process gas flow. For example, FIG. 3 is a schematic perspective view of an example heat exchanger system 300 for a data center farm 302 that is fluidly connected to a heat exchanger 304. The data center farm 302 includes one or more servers 306 (e.g., one or more banks of servers), a chiller 308, a cooling tower 310, and coolant fluid pathways between the servers 306, chiller 308, and/or cooling tower 310. The coolant fluid pathways direct and transmit coolant fluid through the components of the system 300, for example, to cool the servers 306 (e.g., liquid-cooled servers) and direct the heat to the chiller 308, cooling tower 310, or elsewhere. In some instances, the data center farm 302 may exclude the cooling tower 310, chiller 308, or both the cooling tower 310 and chiller 308. In some examples, the servers 306 are liquid-cooled, where coolant fluid from the chiller 308 is directed to the servers 306, and a hot output fluid (after cooling the servers 306) flows from the servers 306 either back to the chiller 308 (as shown in FIG. 3) or directly to the cooling tower 310.

The data center farm 302 can be used as the waste heat process 142 of the example system 100 of FIG. 1, and the heat exchanger 304 of FIG. 3 can be used as the heat exchanger 144 of the heater 122 of the example system 100 of FIG. 1. In the example heat exchanger system 300 of FIG. 3, the data center 302 includes three options for a heat source that the heat exchanger 304 can fluidly connect to. While the example system 300 shows three heat source options, the example system 300 may include only one, only two, or all three options for supplying waste heat to the heat exchanger 304.

In a first option, the heat exchanger 304 fluidly connects to a coolant fluid output from the servers 306, where the heat exchanger 304 captures at least some of the excess heat from the coolant fluid from the hot fluid output. For example, all or some of the coolant fluid from the hot fluid output is diverted to the heat exchanger 304, where the heat exchanger 304 transfers at least some of the heat from the coolant fluid to a different fluid, and the coolant fluid from the heat exchanger 304 is then diverted back into the flow of coolant fluid away from the servers 306 (e.g., toward the chiller 308, cooling tower 310, or elsewhere).

In a second option, the heat exchanger 304 fluidly connects to a hot air output from the cooling tower 310, where the heat exchanger 304 captures at least some of the heat from the hot air that exits the cooling tower 310. For example, all or some of the hot air from the cooling tower 310 is diverted to the heat exchanger 304, where the heat exchanger 304 transfers at least some of the heat from the hot air to a different fluid, and the hot air from the heat exchanger 304 is then diverted back to the cooling tower 310, diverted back to a different flow of hot air, or released to an ambient environment.

In a third option, the heat exchanger 304 fluidly connects to a chiller fluid output from the chiller 308, where the heat exchanger 304 captures at least some of the excess heat from the fluid from the chiller fluid output. For example, all or some of the fluid from the chiller fluid output is diverted to the heat exchanger 304, where the heat exchanger 304 transfers at least some of the heat from the fluid to a different fluid, and the fluid from the heat exchanger 304 is then diverted back into the flow of chiller fluid away from the chiller 308 (e.g., toward the cooling tower 310, or elsewhere). The heat exchanger 304 of the first option, second option, third option, or a combination of these options can be used in the heat exchanger 144 of the heater 122 of the example system 100 of FIG. 1

Figure 4:
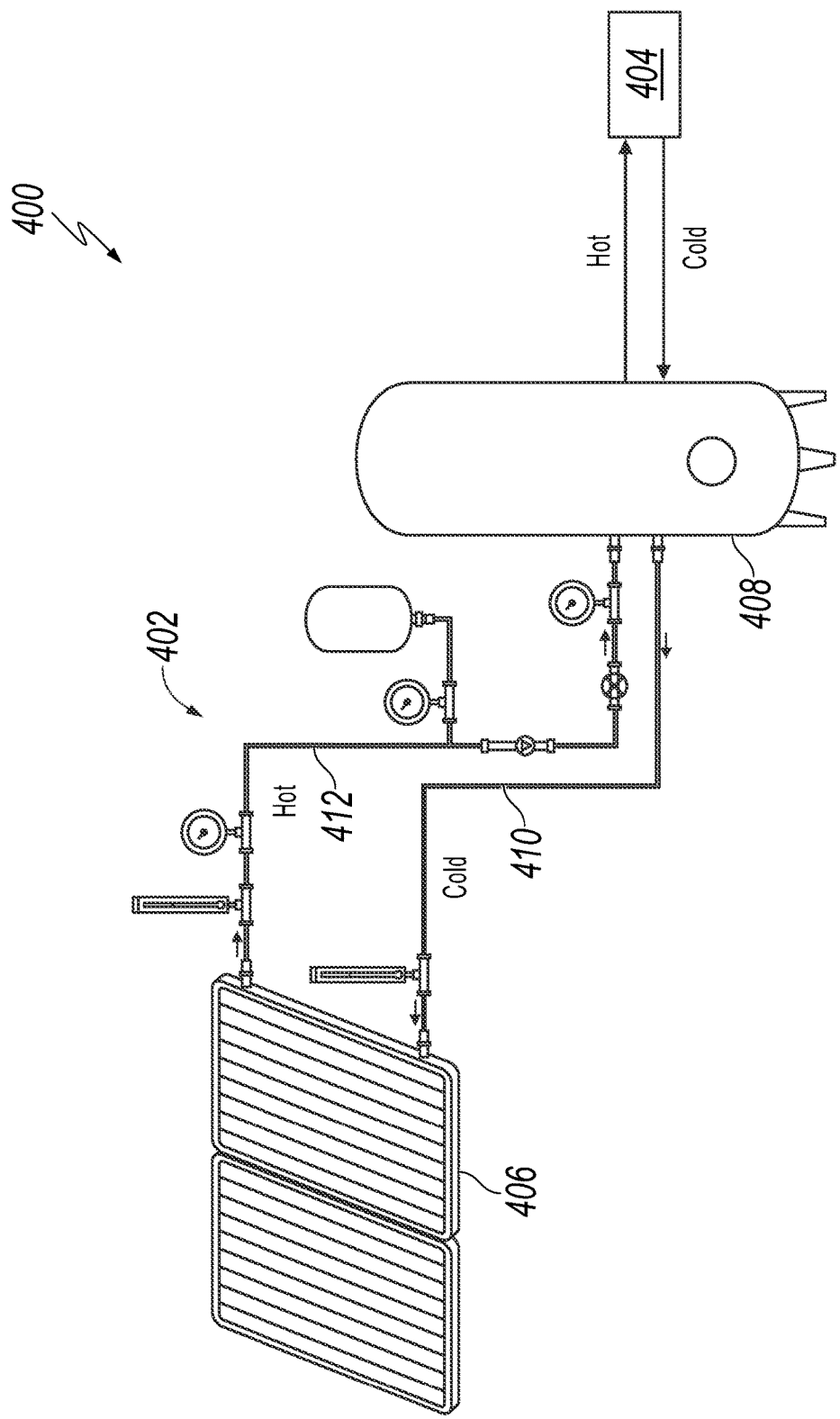
FIG. 4 is a schematic view of an example solar radiation system.

When the waste heat process 142 includes solar radiation, the heat exchanger 144 can be connected to coolant fluid that connects to solar panels or other solar radiation devices. For example, FIG. 4 is a schematic view of an example solar radiation system 400 including a fluid exchange system 402 between one or more solar panels 406 (two shown) and a fluid storage tank 408. A heat exchanger 404 connects to the fluid exchange system 402 directly or via the fluid storage tank 408, and the heat exchanger 404 transfers at least some of the heat from the fluid in the storage tank 408, fluid exchange system 402, or both, to an output fluid of the heat exchanger 404. The solar radiation system 400 can be used as the waste heat process 142 of the example system 100 of FIG. 1, and the heat exchanger 404 of FIG. 4 can be used as the heat exchanger 144 of the heater 122 of the example system 100 of FIG. 1.

When the waste heat process 142 is a gas turbine or combustion engine process, heat exchanger 144 can be connected directly in-line in the engine's liquid cooling flow, downstream of the engine and upstream of the radiator, so that heat exchanger 144 receives the engine's cooling liquid after the liquid has been heated by being circulated through the engine. When the waste heat process is the exhaust of a gas turbine or combustion engine process, the heat exchanger 144 can be directly in-line in the engine's exhaust flow so that heat exchanger 144 receives the engine's hot exhaust. Stationary gas turbine and combustion engines are common in many applications such as used for power generation (both municipal and local), gas pipeline compression, fluid pumping and other applications. When waste heat process 142 is a refinery or other chemical plant process, the heat exchanger 144 can be one or multiple of the various heat exchangers used in the process and/or the heat exchanger 144 can be connected in-line with the cooling liquid of one or multiple of the various heat exchangers used in the process. Although discussed as being in-line with the waste heat fluid flow above, in any of the examples above, the heat exchanger 144 can alternatively be outside of the waste heat fluid flow and coupled via another heat exchanger that is directly in-line in the waste heat fluid flow, and a heat exchange fluid can be circulated between the heat exchanger 144.

The waste heat processes 142 provide free heat energy to the heater 122, which results in zero carbon energy production in the turboexpander 102. Since there is no need to burn natural gas or other fuels for pre-heating with the heater 122, the heater 122 heats the process gas 120 with no consumables, creating an energy-efficient and carbon-neutral heating process. Connecting the heater 122 to the waste heat processes 142 increases the efficiency of the system that includes the waste heat process 142, while also reducing the risk of freezing components of the gas 124 that flows through the turboexpander 102.

Figure 5:
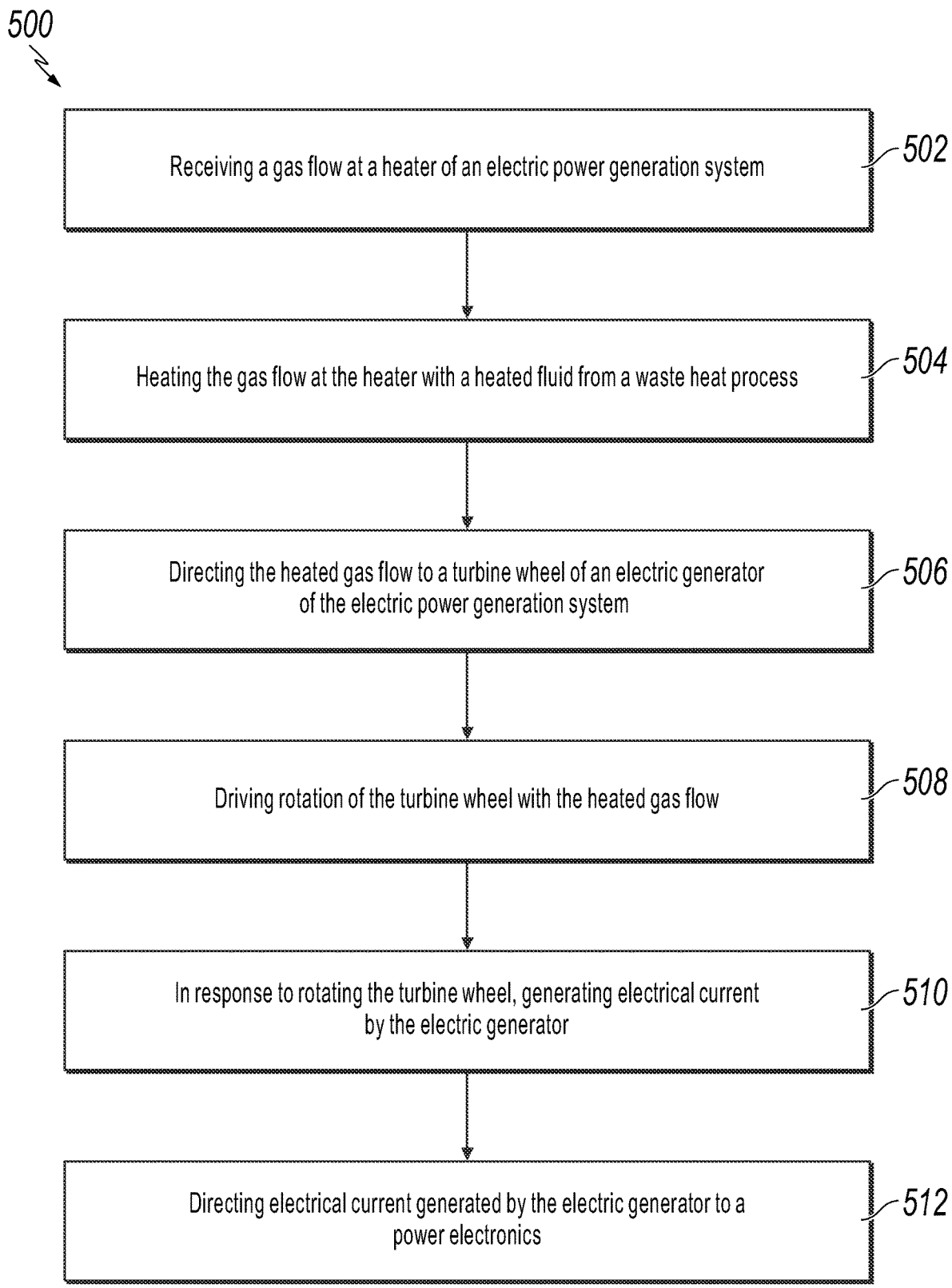
FIG. 5 is a flowchart describing an example method for generating electrical current with an electrical power generation system.

FIG. 5 is a flowchart describing an example method 500 for generating electrical current, for example, performed by the electric power generation system 100 of FIG. 1. At 502, a gas flow is received at a heater of an electric power generation system. At 504, the gas flow is heated at the heater with a heated fluid from a waste heat process. At 506, the heated gas flow is directed to a turbine wheel of an electric generator of the electric power generation system. At 508, the heated gas flow drives rotation of the turbine wheel. At 510, in response to rotating the turbine wheel, electrical current is generated by the electric generator. At 512, the generated electrical current from the electric generator is directed to power electronics.

The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment. In the foregoing specification, a detailed description has been given with reference to specific exemplary embodiments. It will, however, be evident that various modifications and changes may be made thereto without departing from the broader spirit and scope of the disclosure as set forth in the claims.

What is claimed is:

1. A method comprising:
receiving a process gas flow at a heater of an electric power generation system;
heating the process gas flow at the heater with a heated fluid from a waste heat process external to the electric power generation system;
directing the heated gas flow to a turbine wheel of an electric generator of the electric power generation system, the electric generator comprising a turboexpander configured to reduce a pressure and a temperature of the heated process gas flow through the turboexpander;
driving rotation of the turbine wheel with the heated gas flow;
in response to rotating the turbine wheel, generating electrical current by the electric generator; and directing electrical current generated by the electric generator to a power electronics.

2. The method of claim 1, wherein directing the heated gas flow to the turbine wheel comprises directing the heated gas flow through a flow control valve between the heater and the turbine wheel.

3. The method of claim 1, wherein heating the gas flow at the heater comprises transferring heat from the heated fluid to the gas flow with a heat exchanger.

4. The method of claim 3, wherein the heat exchanger comprises a first heat exchanger portion in contact with the gas flow and a second heat exchanger portion in contact with a heated fluid from the waste heat process, and transferring heat from the heated fluid to the gas flow comprises transmitting heat across the heat exchanger from the heated fluid in contact with the second heat exchanger portion to the gas flow in contact with the first heat exchanger portion.

5. The method of claim 1, wherein the heated fluid from the waste heat process comprises at least one of heated fluid from a data server at a data center, heated fluid from a chiller of the data center, or heated air from a cooling tower of the data center, and heating the gas flow comprises transferring heat to the gas flow from the heated fluid or the heated air.

6. The method of claim 1, wherein the heated fluid from the waste heat process comprises exhaust gas from a combustion engine, and heating the gas flow comprises transferring heat from the exhaust gas to the gas flow.

7. The method of claim 1, wherein the heated fluid from the waste heat process comprises exhaust gas from a gas turbine, and heating the gas flow comprises transferring heat from the exhaust gas to the gas flow.

8. The method of claim 1, wherein the heated fluid from the waste heat process comprises fluid from a cooling jacket of a motor, and heating the gas flow comprises transferring heat from the fluid from the cooling jacket to the gas flow.

9. The method of claim 8, wherein the motor comprises a combustion engine or a gas turbine.

10. The method of claim 1, wherein the heated fluid from the waste heat process comprises waste fluid from a refinery, and heating the gas flow comprises transferring heat from the waste fluid to the gas flow.

11. The method of claim 1, wherein the heated fluid from the waste heat process comprises heated fluid from solar radiation, and heating the gas flow comprises transferring heat from the heated fluid to the gas flow.

12. The method of claim 1, further comprising outputting the gas flow from the electric power generation system at a desired output temperature lower than the temperature of the heated process gas flow.

13. The method of claim 1, wherein the turboexpander comprises a high-speed turbine generator configured to operate at speeds of at least 20,000 revolutions per minute.

14. An electric power generation system, comprising:
an electric generator comprising a turboexpander, the turboexpander comprising:
a turbine wheel configured to receive process gas and rotate in response to expansion of the process gas flowing into an inlet of the turbine wheel and out of an outlet of the turbine wheel,
a rotor coupled to the turbine wheel and configured to rotate with the turbine wheel, and
a stationary stator, the electric generator to generate an alternating current upon rotation of the rotor within the stator;
a power electronics system electrically connected to an electrical output of the electric generator and to receive alternating current from the electric generator; and
a heater fluidly coupled to an inlet of the electric generator and to a waste heat fluid source external to the electric generator, the heater configured to transmit heat from fluid from the waste heat fluid source to the process gas.

15. The system of claim 14, wherein the heater comprises a heat exchanger.

16. The system of claim 15, wherein the heat exchanger comprises a first heat exchanger portion in contact with the process gas and a second heat exchanger portion in contact with the fluid from the waste heat fluid source.

17. The system of claim 14, wherein the waste heat fluid source comprises at least one of a data center, a combustion engine exhaust, a gas turbine exhaust, a motor cooling jacket, a refinery, or solar radiation.

18. The system of claim 17, wherein the fluid from the waste heat fluid source comprises at least one of waste air from a data center, heated coolant from a data center, exhaust gas, cooling jacket fluid, or refinery waste fluid.

19. The system of claim 14, wherein the power electronics system comprises a variable speed drive connected to the electrical output of the electric generator, the variable speed drive to convert the alternating current received from the electric generator into an alternating current compatible with a power grid.

20. The system of claim 14, wherein the electric generator comprises a three-phase permanent magnet synchronous generator.

21. A method, comprising:
receiving a gas flow at a heater of an electric power generation system;
heating the gas flow at the heater with a heated fluid from a waste heat process external to the electric power generation system, the heater comprising a heat exchanger configured to transmit heat from the heated fluid to the gas flow;
directing the heated gas flow to a turbine wheel of an electric generator of the electric power generation system, the heated gas flow having a first temperature and a first pressure;
driving rotation of the turbine wheel with the heated gas flow;
in response to rotating the turbine wheel, generating electrical current by the electric generator; and
outputting the gas flow from the electric power generation system at a second temperature and a second pressure lower than the first temperature and first pressure of the heated gas flow.

* * * * *